(12) United States Patent
Despain

(10) Patent No.: US 8,386,549 B1
(45) Date of Patent: Feb. 26, 2013

(54) REDUCED COMPLEXITY ADAPTIVE MULTISTAGE WIENER FILTER

(75) Inventor: Alvin M. Despain, Los Angeles, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 1392 days.

(21) Appl. No.: 12/042,260

(22) Filed: Mar. 4, 2008

(51) Int. Cl.
*G06F 17/10* (2006.01)
(52) U.S. Cl. .................................. 708/300; 708/200
(58) Field of Classification Search .................. 708/300
See application file for complete search history.

(56) References Cited

U.S. PATENT DOCUMENTS

| | | | |
|---|---|---|---|
| 5,734,598 A | 3/1998 | Abott et al. | |
| 6,175,588 B1 | 1/2001 | Viscotsky et al. | |
| 6,498,359 B2 | 12/2002 | Schmidt et al. | |
| 7,019,326 B2 | 3/2006 | Cea et al. | |
| 7,181,085 B1 * | 2/2007 | Despain ....................... | 382/261 |
| 2002/0065664 A1 | 5/2002 | Witzgall et al. | |
| 2002/0136277 A1 | 9/2002 | Reed et al. | |
| 2002/0152253 A1 * | 10/2002 | Ricks et al. ................... | 708/520 |
| 2002/0191568 A1 | 12/2002 | Ghosh | |
| 2003/0227886 A1 | 12/2003 | Abrishamkar et al. | |

FOREIGN PATENT DOCUMENTS

| | | |
|---|---|---|
| WO | WO 00/67389 A | 11/2000 |
| WO | PCT/US03/10180 | 7/2003 |
| WO | WO 03/085830 A | 10/2003 |
| WO | PCT/US2005/025335 | 8/2006 |

OTHER PUBLICATIONS

Goldstein and Chowdhury and Zoltowski, Reduced-Rank Chip-Level MMSE Equalization for the 3G CDMA Forward Link woth Code-Multiplexed Pilot, 2002, Hindawi Publishing Corporation, EARASIP Journal on Applied Signal Processing, pp. 771-786.*
J. S. Goldstein, I. S. Reed and L. L. Schart, A Multistage Representation of the Wiener filter Based on Orthogonal Projections, IEEE Transactions on Information Theory, vol. 44, No. 7, Nov. 1998.
M. L. Honig and J. S. Goldstein, "Adaptive Reduced-Rank Residual Correlation Algorithms for DS-CDMA Interference Suppression," In Proc. 32th Asilomar Conference Signals, Systems and Computer, Pacific Grove, CA, Nov. 1998.
D. C. Ricks and J. S. Goldstein, "Efficient Architectures for Implementing Adaptive Algorithms," Proceedings of the 2000 Antenna applications Symposium, Allerton Park, Monticello, IL., Sep. 20-22, 2000.

(Continued)

*Primary Examiner* — Chat Do
*Assistant Examiner* — Kevin G Hughes
(74) *Attorney, Agent, or Firm* — Orrick, Herrington & Sutcliffe LLP

(57) ABSTRACT

Multistage Wiener filters (MWF) represent a component of the MWF as an un-normalized vector of filter coefficients within a finite impulse response (FIR) filter in a manner that avoids reliance on the 2-norm operation of the un-normalized vector of coefficients. The 2-norm operation can be replaced by less expensive operations performed elsewhere in the MWF. Preferably the filter adds only a few additional addition, subtraction and multiplication operations to compensate for the elimination of the square root and the division operations used for the 2-norm operation. As a result, it is possible to eliminate all or nearly all of the square rod and arithmetic division operations of at least some implementations of the MWF.

6 Claims, 18 Drawing Sheets

OTHER PUBLICATIONS

J. S. Goldstein and I. S. Reed, "Reduced-Rank Adaptive Filtering," IEEE Transactions on Signal Processing, vol. 45, No. 2, Feb. 1997.

M. L. Honig and W. Xiao, "Performance of Reduced Rank Linear Interference," work supported by U. S. Army Research office under grant DAAH04-96-I-0378, Jan. 2001.

D. C. Ricks, P. G. Cifuentes and J. S. Goldstein, "What is Optimal Processing for Nonstationary Data?" Conference Record of the Thirty Fourth Annual Asilomar Conference on Signals, Systems and Computers, Pacific Grove California, Oct. 29-Nov. 2, 2002.

J. S. Goldstein and I. S. Reed, "Performance measures for Optimal Constrained Beamformers," IEEE Transactions on Antennas and Propagation, vol. 45, No. 1, Jan. 1997.

J. S. Goldstein, I. S. Reed, and R. N. Smith, "Low-Complexity Subspace Selection for Partial Adaptivity", Proceedings of IEE Milcom, Oct. 1996.

W. L. Myrick, M. D. Zoltowski and J. S. Goldstein, "Low-Sample Performance of Reduced-Rank Power Minimization Based Jammer Suppression for GPS," IEEE $6^{th}$ International Symposium Tech. & Appli., NJIT, New Jersey, Sep. 6-8, 2000.

W. Chen, U. Mitra and P. Schniter, "Reduced Rank Detection Schemes for DS-CDMA Communication Systems," private communication, Jan. 2002.

J. Scott Goldstein, et al., "A New Method of Wiener Filtering and its Application to Interference Mitigation for Communications," IEEE, pp. 1087-1091, 1997.

Colin D. Frank, et al. "Adaptive Interference Suppression for the Downlink of a Direct Sequence CDMS System with Long Spreading Sequences, " Part of work was presented at the $36^{th}$ Annual Allerton Conference on Communication, Control and Computing, Monticello, Illinois, pp. 1-31, Sep. 1998.

Samina Chowdhury, et al. "Reduced-Rank Chip-level MMSE Equalization for the 3G CDMA Forward Link with CodeMultiplexed Pilot," Invited Paper for Special Issue of EURASIP Journal on Applied Signal Processing, pp. 1-27, Jul. 2001.

Belkacem Mouhouche, et al., "Chip-Level MMSE Equalization in the Forward Link of UMTS-FDD: A Low Complexity Approach," IEEE, pp. 1015-1019, 2003.

M. Joham, et al. "A New Backward Recursion for the Multi-Stage Nested Wiener Filter Employing Krylov Subspace Methods," pp. 1-4.

Michael L. Honig, "Adaptive Reduced-Rank Interference Suppression Based on the Multistage Wiener Filter," IEEE Transactions on Communications, vol. 50, No. 6, pp. 986-994, Jun. 2004.

EPO Communication dated Jun. 20, 2008 regarding Application No. 03 726 180.7—2215.

Saeed V. Vaseghi, "Wiener Filters," Advanced Digital Signal Processing and Noise Reduction, Second Edition, pp. 179-204.

* cited by examiner

REDUCED COMPLEXITY ADAPTIVE MULTISTAGE WIENER FILTER

BACKGROUND

1. Field of the Invention

The present invention relates generally to reducing the complexity and implementation cost of the processing of signals by a Wiener filter as employed in a wide variety of signal processing systems including radio, radar, telephone and cellular telephone receivers.

2. Description of the Related Art

The Wiener filter is the optimal linear filter to separate signals from noise and interference. Multistage Wiener filters (MWF) are well suited for communication applications. Implementing the 'blocking matrix' employed in a multistage Wiener filter can require a relatively expensive operation of normalizing a vector of filter coefficients. Normalizing the vector is accomplished by calculating the 2-norm of the vector of filter coefficients. When an MWF is designed to be adaptive, the 2-norm operation is often required after every adaptive step. This may be very expensive, time consuming or complex.

SUMMARY OF THE PREFERRED EMBODIMENTS

An aspect of the present invention provides a multiple stage Wiener filter comprising a plurality of stages in which a first stage comprises a forward part and a backward part. The forward part comprises a scalar-vector correlation module that determines an expectation value for a product of a scalar input signal input to the first stage and a vector input signal input to the first stage, the scalar-vector correlation module producing a vector correlation module output signal. A filter module accepts the vector correlation module output signal and the vector input signal input to the first stage and produces with an inner product calculation a scalar filter module output signal. A vector squared-magnitude module accepts the vector correlation module output signal and calculates a scalar squared-magnitude module output signal that is a reciprocal of a sum of squared magnitudes of components of the vector correlation module output signal.

Another aspect of the present invention provides a multiple stage Wiener filter comprising a plurality of stages in which at least one stage is composed of a forward part and a backward part. The forward part comprises a scalar-vector correlation module that determines an expectation value for a product of a complement of a scalar input signal input to the stage and a vector input signal input to the stage, the scalar-vector correlation module producing a vector correlation module output signal. A vector subtraction module subtracts a compensated vector signal produced by a compensation module from the vector correlation module output signal. A vector squared-magnitude module accepts the vector correlation module output signal from the vector subtraction module and calculates a scalar squared-magnitude module output signal that is a reciprocal of a sum of squared magnitudes of components of the vector correlation module output signal. A first filter module accepts the vector output signal from the vector subtraction module and the vector signal input to the stage and produces with an inner product calculation a scalar filter module output signal. A scalar subtraction module subtracts a compensated scalar signal generated by the compensation module from the scalar filter module output signal.

According to this aspect of the invention, the compensation module accepts as inputs two vector signals, a first scalar signal and its complement, and a first scalar magnitude signal. The compensation module produces as outputs the compensated vector signal and the compensated scalar signal. The compensation module comprises a first scalar multiplier module that calculates a squared magnitude signal from the first scalar signal and its complement. A scalar-scalar correlation module receives the squared magnitude signal and determines and outputs an expectation value for the squared magnitude of the first scalar signal. A scalar-scalar multiplier module multiplies the expectation value output by the scalar-scalar correlation module by the input scalar magnitude signal to produce a scalar-scalar multiplier module output. A vector-scalar multiplier module multiplies the output of the scalar-scalar multiplication module by a first vector signal input to the compensation module producing the compensated vector signal. A second filter module accepts the two vector signals input to the compensation module and produces a scalar magnitude output signal. A second scalar multiplier module multiplies the scalar magnitude output signal from the second filter module by the first scalar magnitude signal producing a second magnitude signal. A third scalar multiplier module multiplies the second magnitude signal by the first scalar input signal producing the compensated scalar signal.

BRIEF DESCRIPTION OF THE DRAWINGS

The invention is described in conjunction with the accompanying drawings which form a part of this disclosure.

Figure 5A:
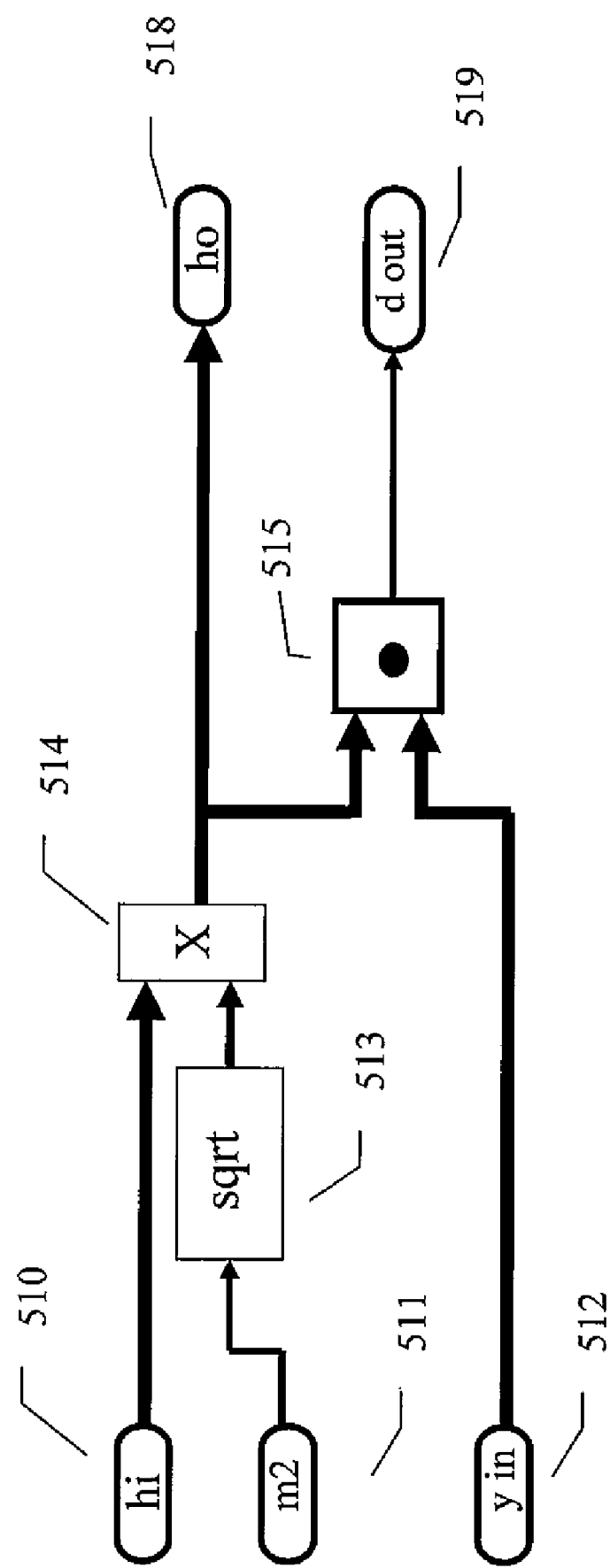
FIG. 5a schematically illustrates the normalization of the filter coefficient vector and calculation of a 'matched filter' output.
Figure 5B:
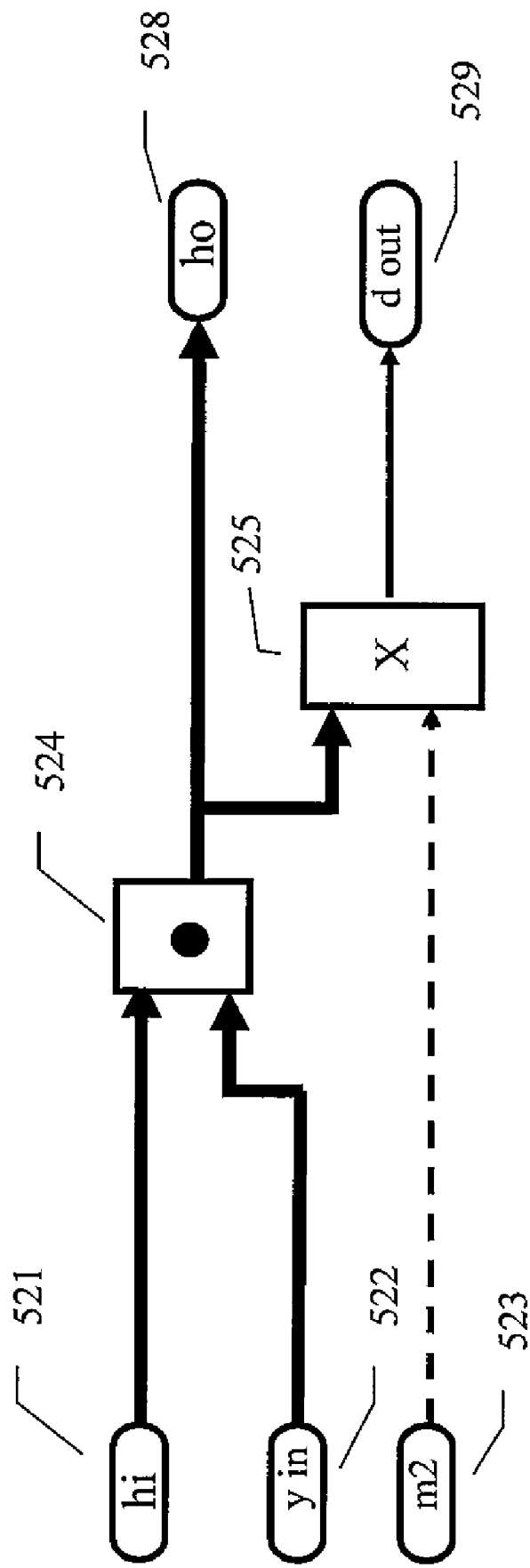

FIG. 5b schematically illustrates the normalization of the filter coefficient vector and generation of a 'matched filter' output. Implementations of FIG. 5b can provide significant cost or complexity savings as compared to implementations of FIG. 5a. The circuit of FIG. 5b is most advantageous when the filter update rate is relatively high so as to rapidly adapt to changing propagation conditions.

Figure 5C:
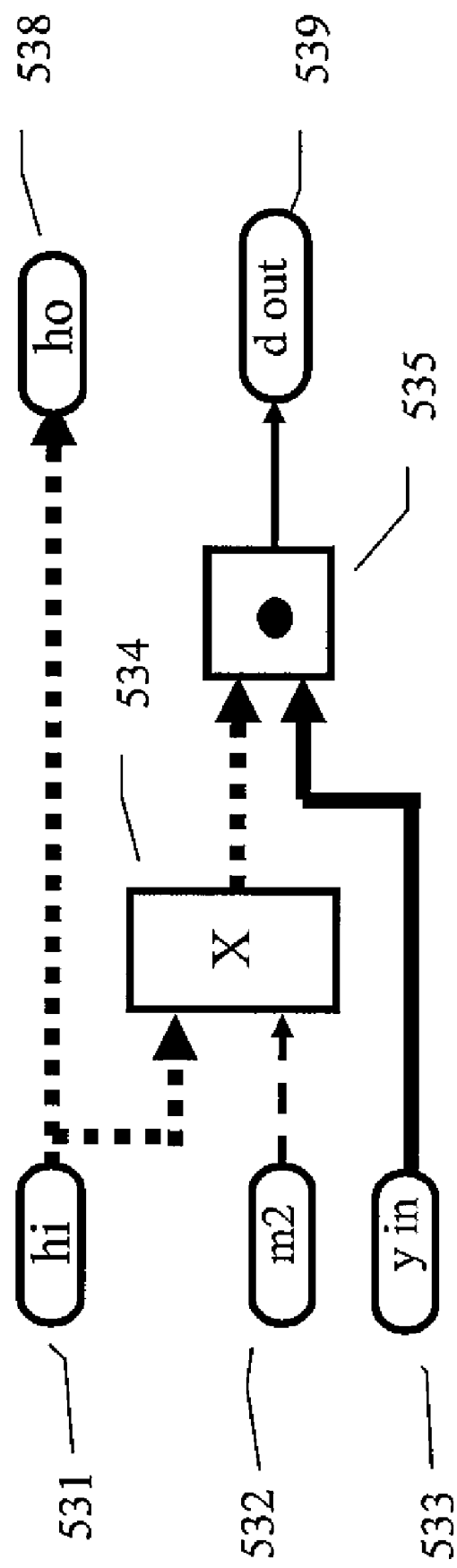

FIG. 5c schematically illustrates the normalization of the filter coefficient vector and generation of a 'matched filter' output when the desired filter update rate is relatively low compared to the filter data processing rate. Implementations of FIG. 5c can provide significant cost or complexity savings for this case as compared to FIG. 5b.

Figure 2:
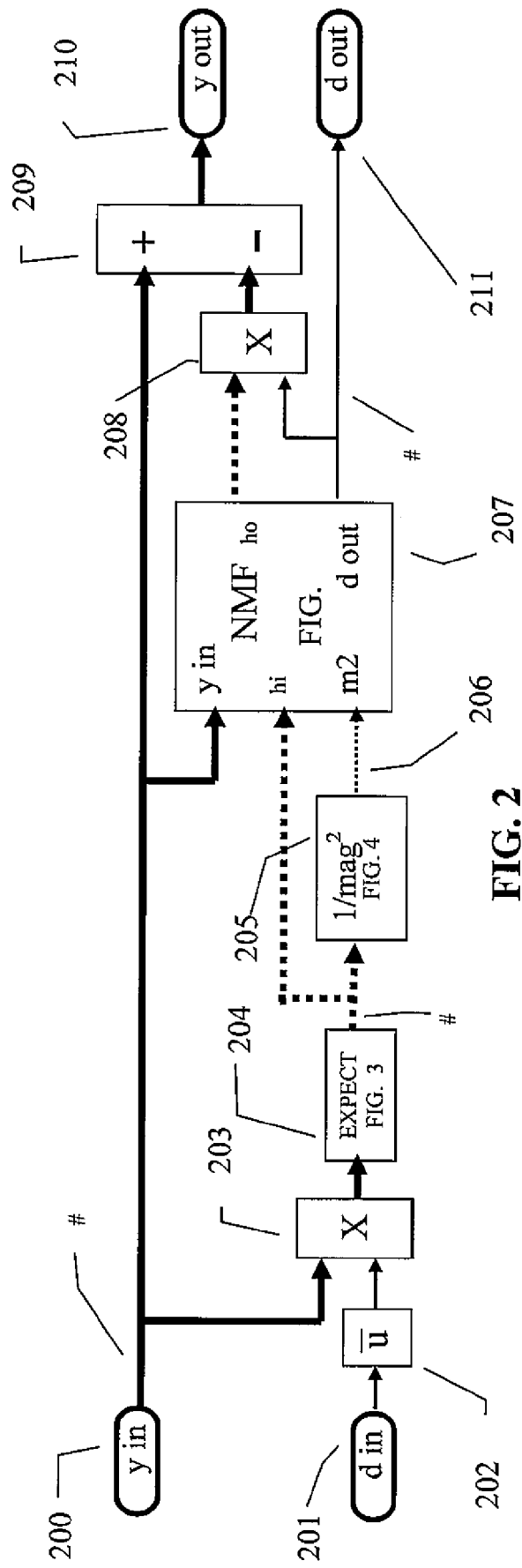
FIG. 2 is a schematic illustration of an example of an upper half of a single stage (i.e., one forward stage) of an adaptive MWF.
Figure 6:
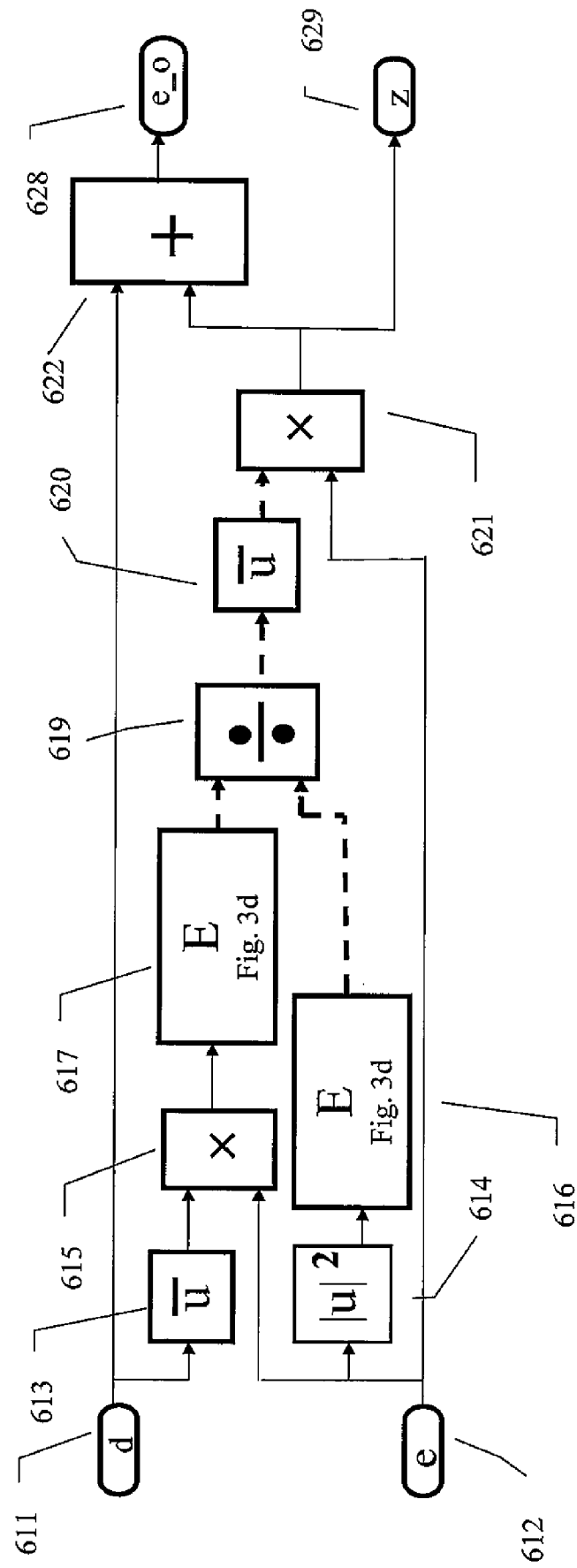

FIG. 6 schematically illustrates an embodiment of the lower half of a filter stage (the "backwards modules" of FIG. 2).

FIGS. 7-11 illustrate aspects of especially preferred embodiments of the present invention. Some modules illustrated in FIGS. 1-6 may also be employed in the embodiments illustrated in FIGS. 7-11.

Figure 7:
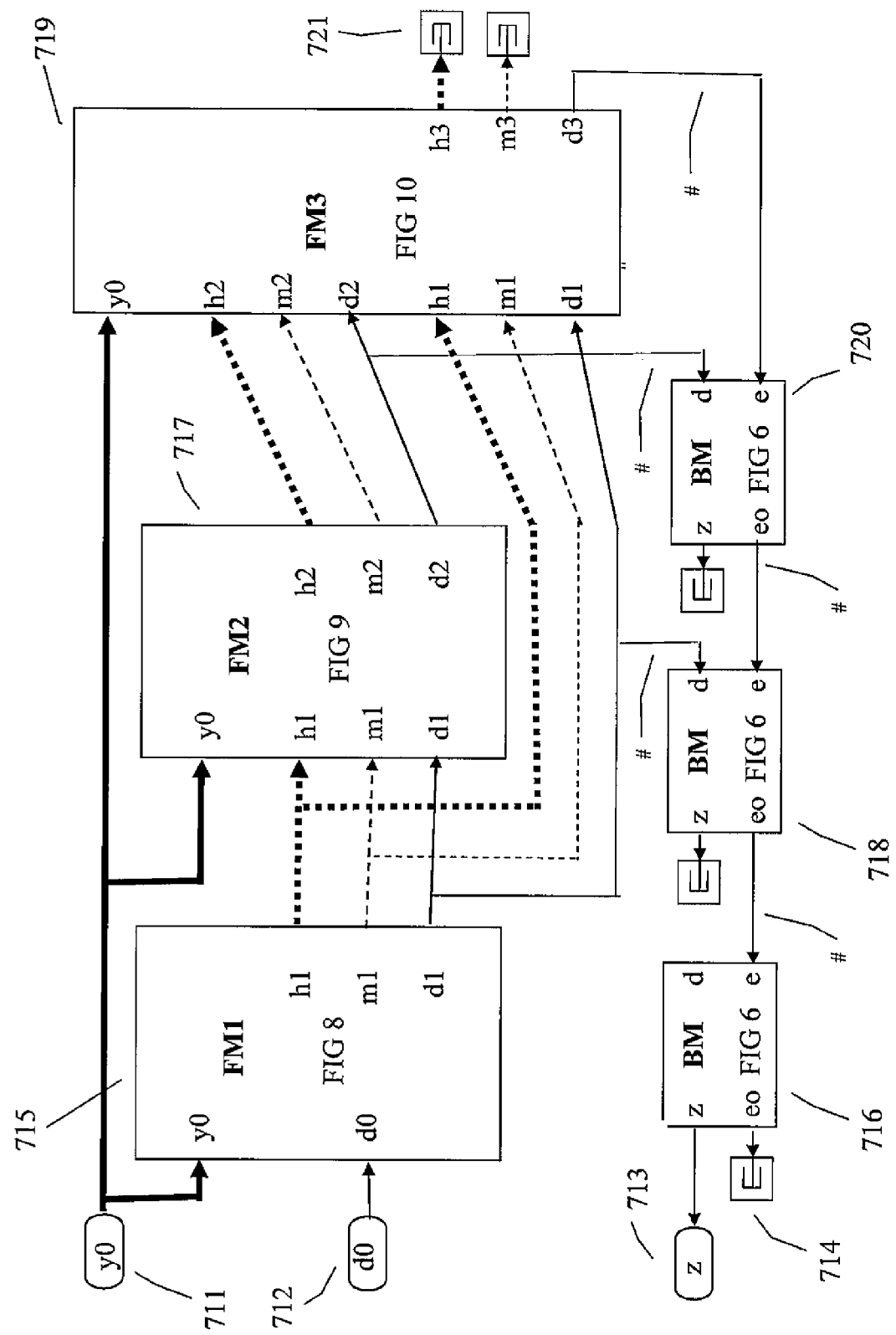

FIG. 7 schematically illustrates a multistage Wiener filter circuit having three stages.

Figure 8:
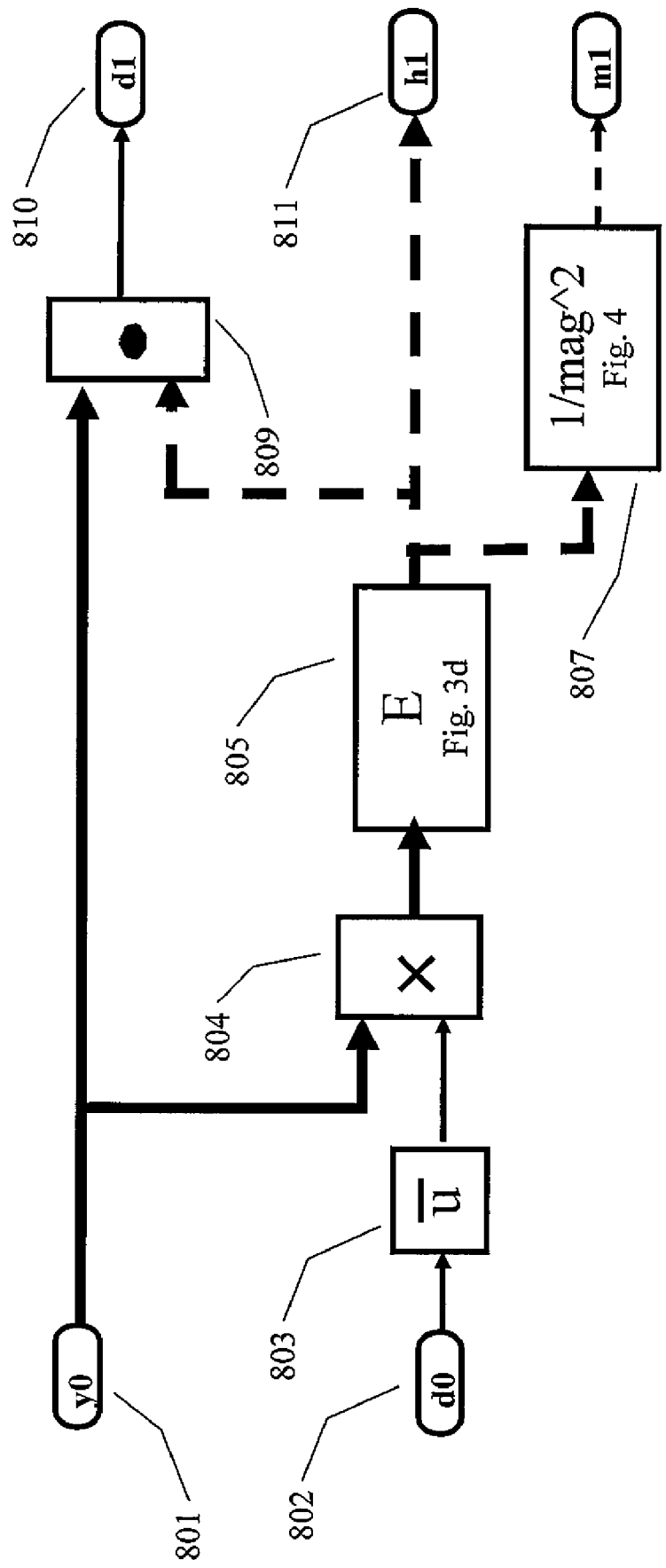

FIG. 8 schematically illustrates a first stage forward module 71 that might be used in the MWF of FIG. 7.

Figure 9:
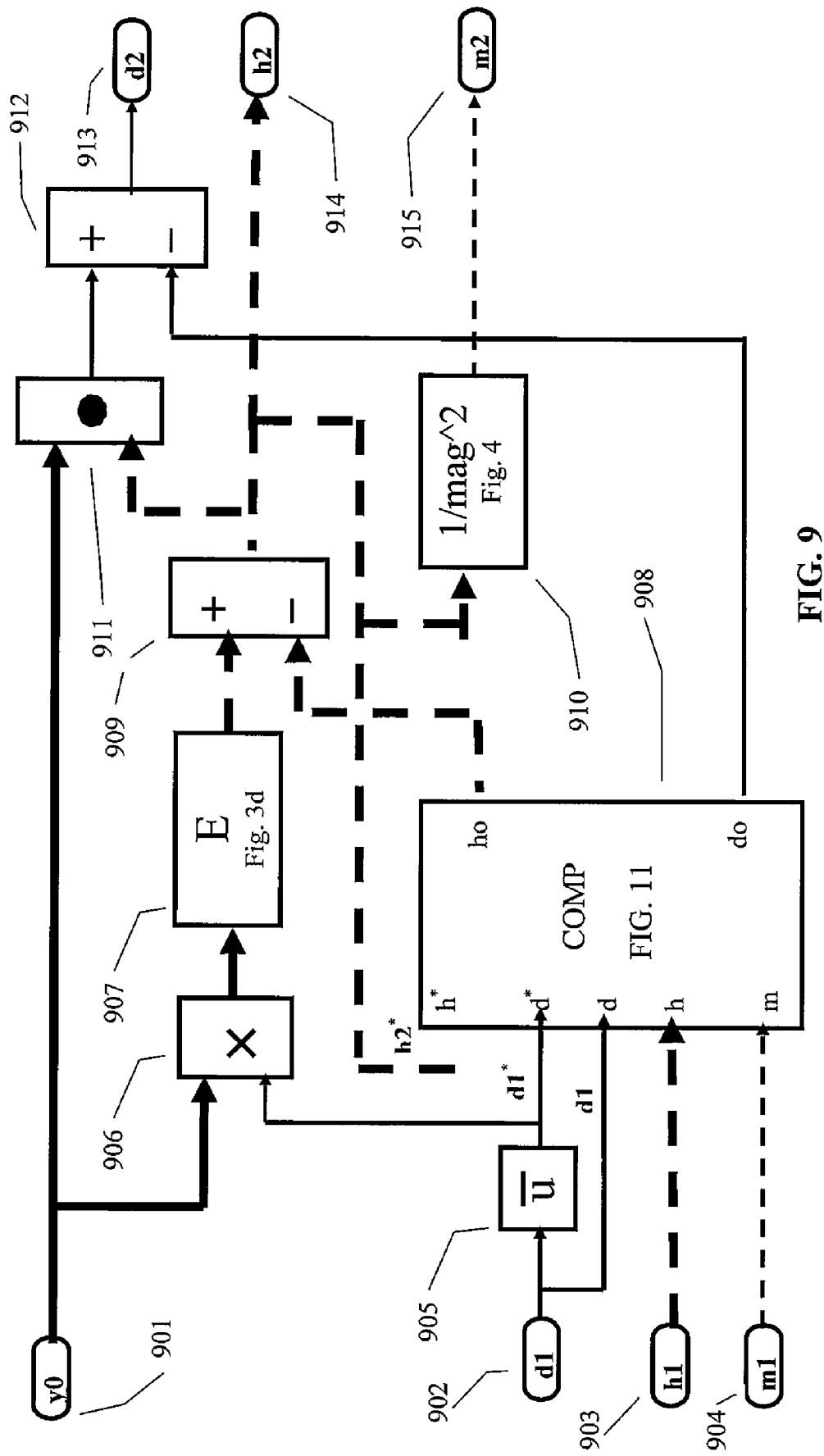

FIG. 9 schematically illustrates a second stage forward module 72 that might be used in the MWF of FIG. 7.

Figure 10:
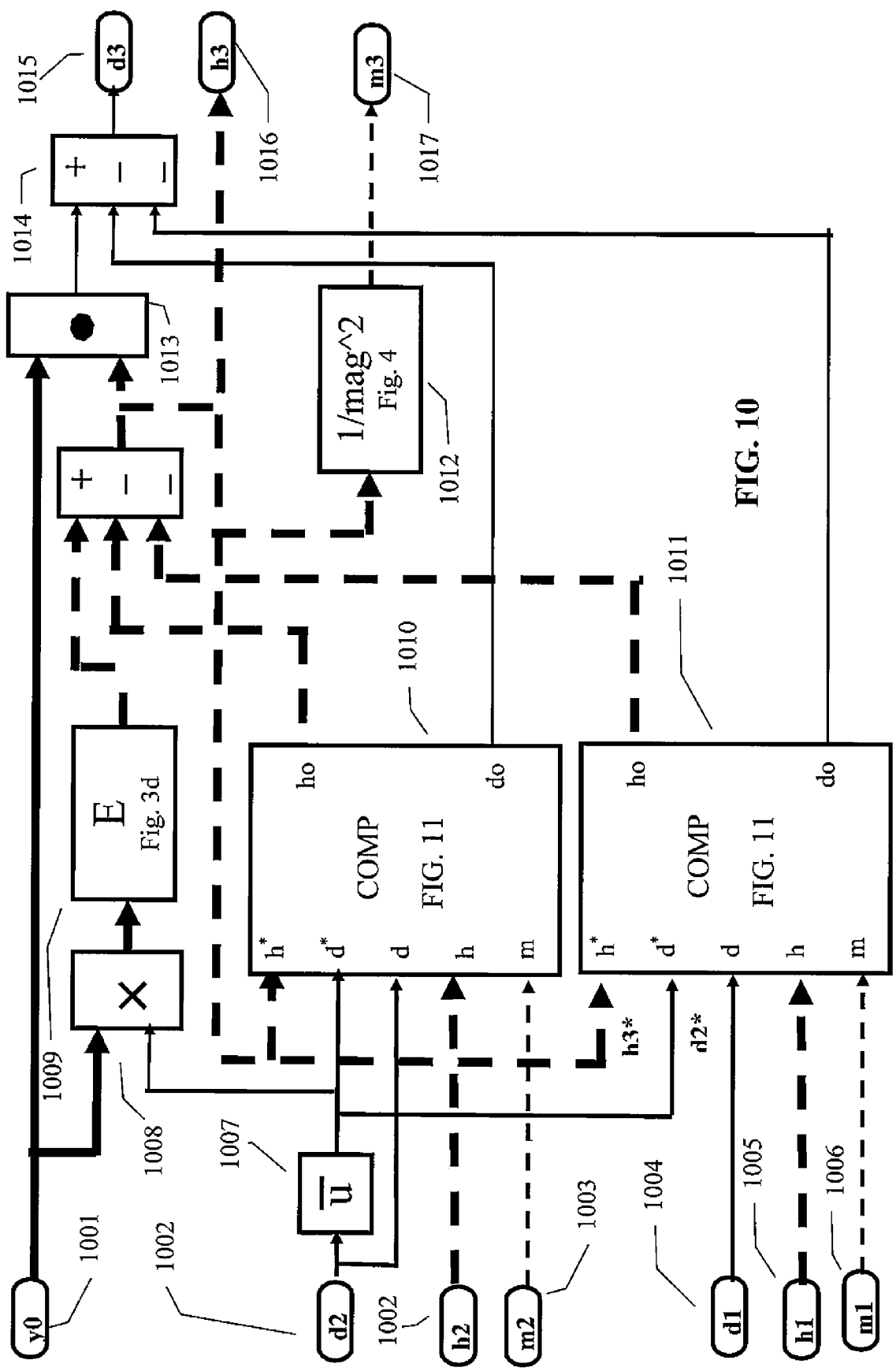

FIG. 10 schematically illustrates a third stage forward module 73 that might be used in the MWF of FIG. 7.

Figure 11:
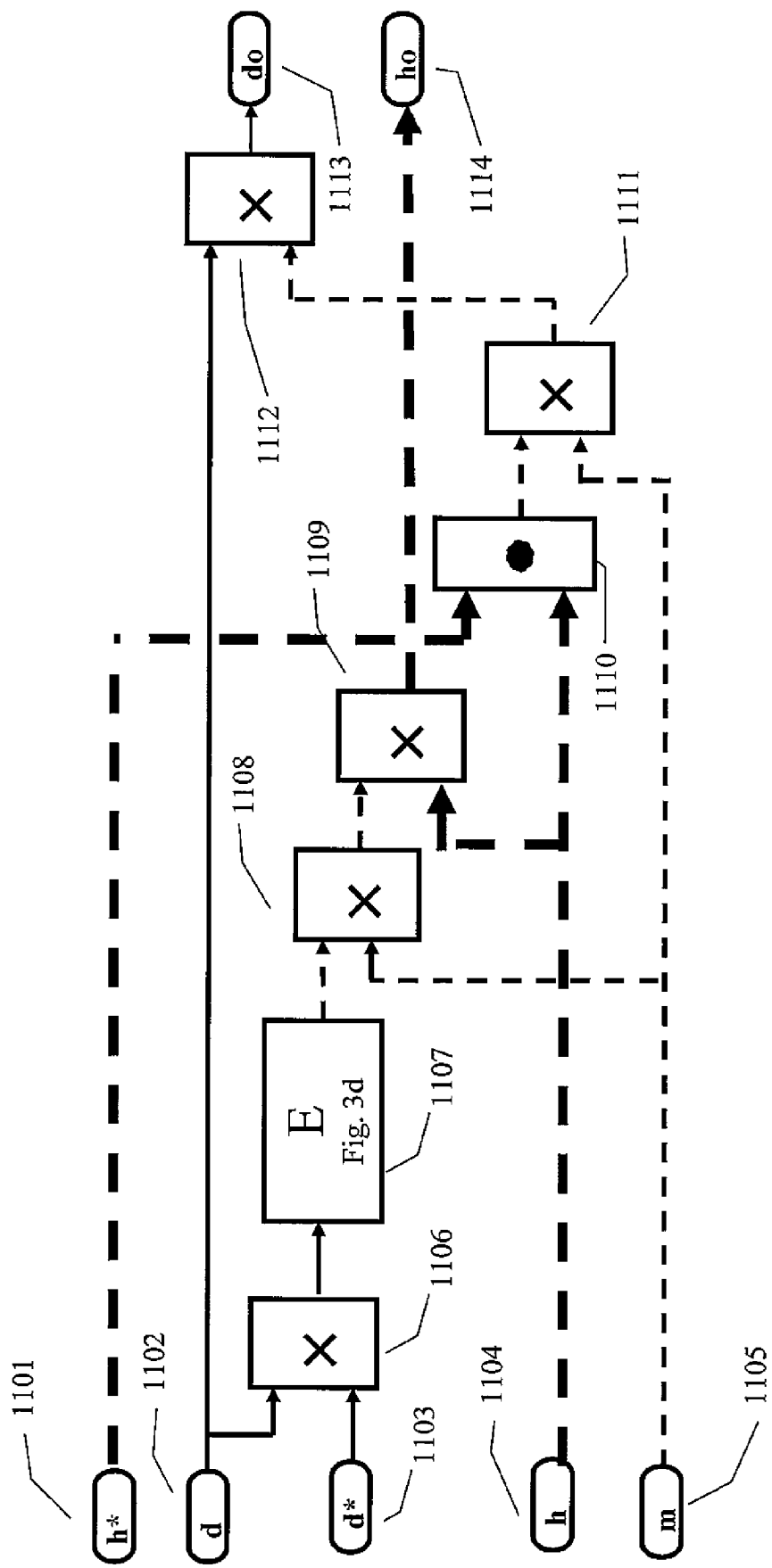

FIG. 11 schematically illustrates an implementation of the compensation module COMP that appears once in FIG. 9 and twice in FIG. 10. The COMP module preferably calculates a compensating signal that preferably compensates for the lack of the 2-norm function in the forward modules.

In the drawings, scalar signals are shown as fine lines while vector signals are shown as heavy lines. Lines may be carriers of real signals, complex signals or both. Solid lines in the drawings indicate signals that occur at the data filter rate. Dashed lines indicate signals that preferably only occur at the filter coefficient update rate, generally many times slower than the data filter rate.

In the drawings some lines are identified with a '#'. This indicates that an arbitrary gain (or attenuation) operation can be placed within the signal line without modifying the result of the filtering operation. Most preferably, implementations employ such scaling operations in fixed point (i.e. integer) implementations of preferred multistage Wiener filters to avoid underflow or overflow for the integer representation. Preferred implementations of the filters are insensitive to gain changes at these many indicated points.

DETAILED DESCRIPTION OF THE PREFERRED EMBODIMENTS

Notation:

All signals internal to the receiver are discrete digital values provided at discrete points in time. When it aids understanding to make the time function explicit, a variable is shown here as a function of a time index such as "s(t)".

In the equations that follow, unless otherwise noted, capital letters represent matrices, e.g., "R", while underscored lower case letters, e.g., "$\underline{x}$", represent column vectors and plain lowercase letters, e.g., "z", represent scalars.

The complex conjugate of an element is indicated by a superscript "*".

A capital H superscript of a vector or matrix, e.g., "$R^H$" indicates the complex conjugate transposition of the elements.

The notation E[x] or E[$\underline{x}$] indicates the mathematical expectation of the variable x or $\underline{x}$ respectively. This is preferably implemented as either a simple average over a period of time or a weighted average over an interval that will be apparent from the context.

The notation "2-norm [$\underline{x}$]" indicates the normalization of vector $\underline{x}$ to unity magnitude or $\underline{x}/|\underline{x}|$. The result is a vector, each of whose elements is the corresponding element of the vector $\underline{x}$ divided by the square root of the sum of all of the magnitude squared elements of $\underline{x}$.

It will be convenient to indicate un-normalized variables in italics, e.g., $\underline{h} = (\underline{h}^H \underline{h})^{-1/2} \underline{h}$. This is just an aid to the reader, as the explicit definitions are employed as discussed above.

Description

Preferred embodiments of the present invention include multistage Wiener filters (MWF) that represent a component of the MWF as an un-normalized vector of filter coefficients within a finite impulse response (FIR) filter in a manner that avoids reliance on the 2-norm operation of the un-normalized vector of coefficients. The 2-norm operation can be replaced by less expensive operations performed elsewhere in the MWF. Preferably the filter adds only a few additional addition, subtraction and multiplication operations to compensate for the elimination of the square root and the division operations used for the 2-norm operation. As a result, it is possible to eliminate all or nearly all of the square root and arithmetic division operations of at least some implementations of the MWF.

Preferred embodiments of the present invention can provide a method or an apparatus to reduce the complexity and cost of an adaptive multistage Wiener filter. Implementations of the present invention can be compatible with other complexity reduction techniques such as those described, for example, in patent application Ser. No. 11/098,741, which application is incorporated by reference in its entirety here.

One example of a multistage Wiener filter uses a non-adaptive 'steering vector' as the first stage of the MWF. Each of the other stages includes a matched filter h, a blocking matrix filter B, a scalar multiplier and an adder. Improvements on that basic system preferably provide a fully adaptive first stage by using a reference signal $d_0(t)$ in place of the static 'steering vector.' These improvements and background on the basic system are described in U.S. Pat. No. 7,181,085 and U.S. patent application Serial No. 10/894,913, each of which is incorporated by reference in its entirety here. The input to each stage of the preferred MWF described in the above-referenced patent applications is the vector signal $\underline{y}(t)$ and the scalar signal d(t).

Figure 1:
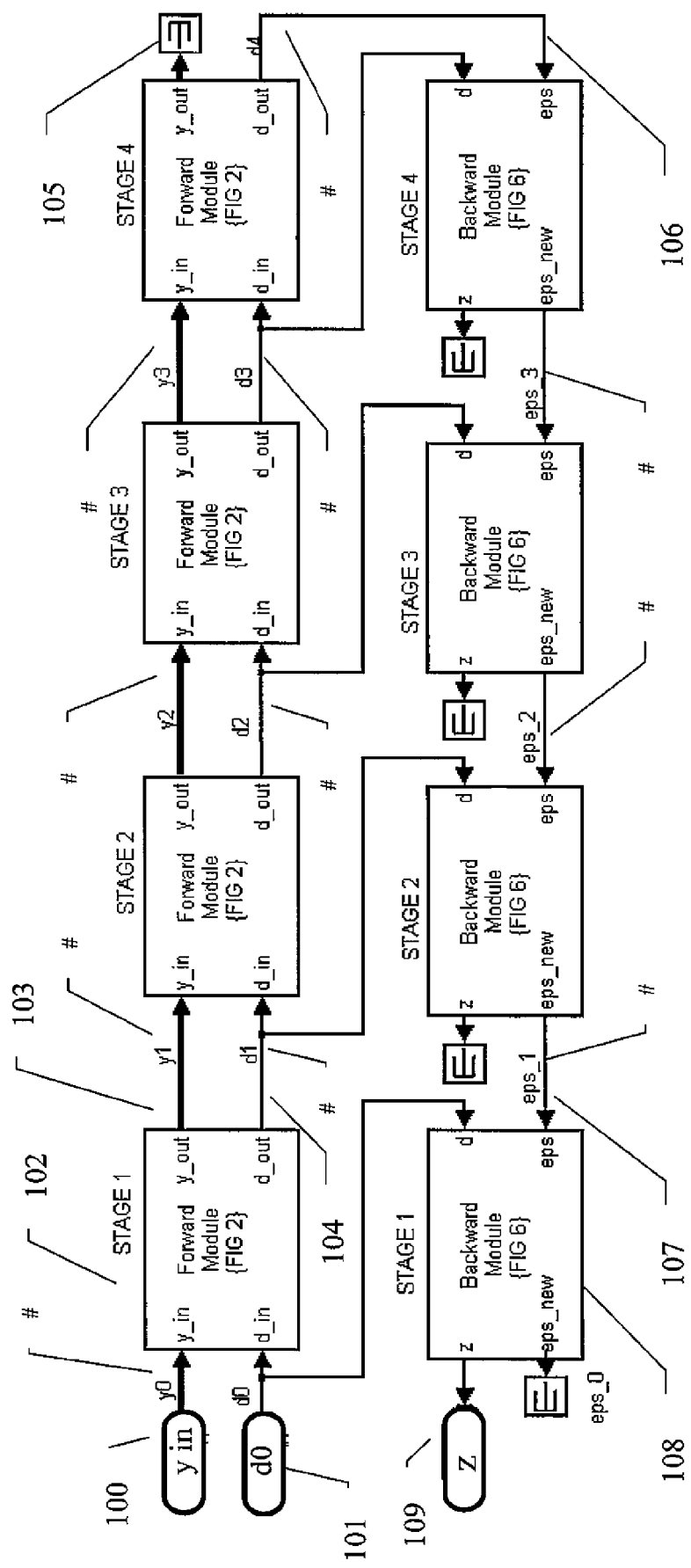
FIG. 1 is a schematic illustration of a multistage Wiener filter (MFW).

The output from each stage k of the MWF described in the above-referenced patent applications is the vector signal $\underline{y}_k(t)$ and the estimated desired scalar signal $d_k(t)$. FIG. 1 schematically illustrates this multistage Wiener filter. The signal $d_k(t)$ is the matched filter $\underline{h}_k(t)$ output $$d(t) = \underline{h}^H(t)\underline{y}(t) \tag{1}$$

The matched filter h is calculated in the usual way to produce:

$$\underline{h}(t) = 2\text{-norm}[E[d(t)\underline{y}(t)]] \tag{2}$$

The Expectation operator is accurately approximated here by a simple average:

$$E[d(t)\underline{y}(t)] \approx \underline{x}(j) \tag{3}$$

where $$\underline{x}(j) = (1/n) \sum_{i=j-n+1}^{j} (d(i)\underline{y}(i)) \quad (4)$$

For the adaptive filter case the average preferably is over an interval that is short as compared to any significant changes in the statistics of d or y. So long as the interval remains short compared to the time periods over which d and y change, the approximation is improved as the average is taken over longer intervals. For the filter to be adaptive, the filter coefficients preferably are updated at each interval.

What follows omits the notation of showing the explicit time dependence to simplify the equations that describe the filters.

The 2-norm operator divides its argument by the square root of the sum of the squares of the magnitudes of the components of the vector of its argument:

$$2\text{-norm}(\underline{\chi}) = \underline{\chi}(\Sigma_k|\chi_k|^2)^{-1/2} \quad (5)$$

The result of the 2-norm operation is a normalized vector of unity magnitude. Therefore, for any constant c:

$$\underline{h} = 2\text{-norm}[\underline{\chi}/c] = 2\text{-norm}[\underline{\chi}] = \underline{\chi} m^{-1/2} \quad (6)$$

where $$m = \Sigma_k|\chi_k|^2 \quad (7)$$

There are many possible implementations of the blocking matrix module B that preferably is used in multistage Wiener filter implementations. The example that follows focuses on one currently preferred possibility. A particularly simple choice for the blocking matrix is:

$$B = I - \underline{h}\underline{h}^H \quad (8)$$

Here, B is the blocking matrix, I is the identity matrix, h is the matched filter vector and superscript H represents the complex transpose operator. To perform the blocking function, h is preferably normalized such that it has a magnitude of unity:

$$\underline{h} = 2\text{-norm}(\underline{\chi}_j) = \underline{\chi} m^{-1/2} \quad (9)$$

Using equations (8) and (9) produces the following module output:

$$\underline{y}_{i+1} = B\underline{y}_i - \underline{h}\underline{h}_i^H \underline{y}_i = \underline{y}_i - d\underline{h}_i \quad (10)$$

With this form, a forward module 102 of FIG. 1 of a single stage of the MWF appears as shown in FIG. 2 while the components of the backwards module 108 of FIG. 1 are as shown in FIG. 6.

Figure 3A:
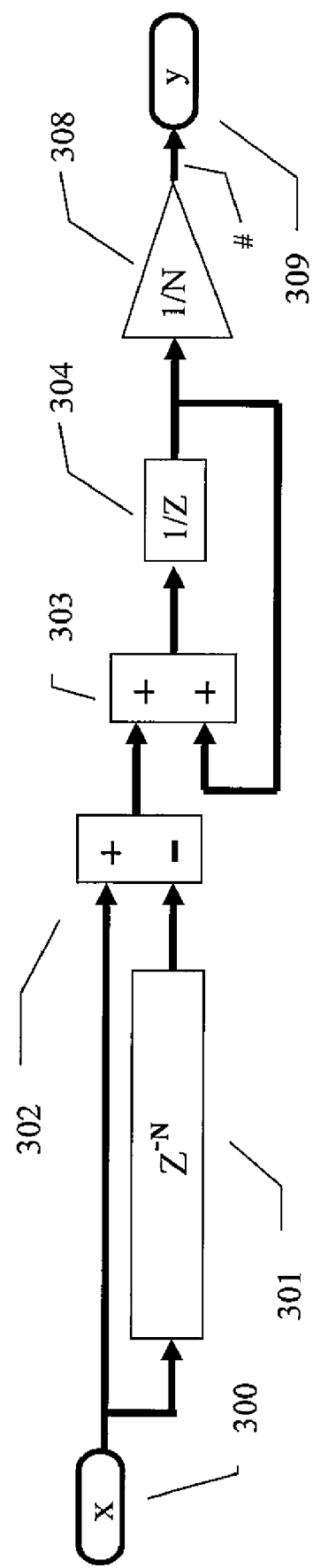
FIG. 3a schematically illustrates how the expectation operator (the EXPECT module) of FIG. 2 preferably is implemented when the filter is employed in systems in which a moving exponential weighting window is desired for technical or cost reasons.
Figure 4:
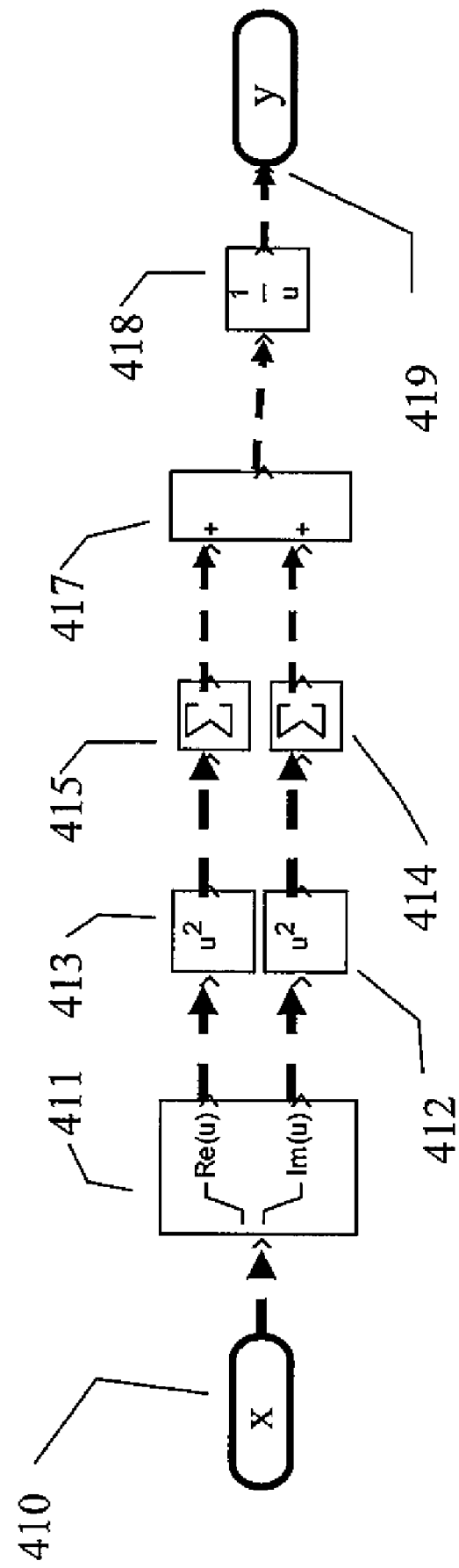
FIG. 4 schematically illustrates how an inverse magnitude squared of a complex number vector is determined as in the "1/mag^2" module of FIG. 2.

The complexity of conventional implementations of a forward module like that shown in the FIG. 2 stage of the MWF is primarily associated with two circuits:
1) Conventional implementations of the correlation circuit 204 'EXPECT' that calculates E[d y], the expectation of (d y) as shown in FIG. 3a; and
2) Conventional implementations of the normalization circuit 205 '1/mag²' as shown in FIG. 4 and conventional implementations of the circuit 207 'NMF,' the normalizing 'matched filter' that calculates h from the expectation (d y) as shown in FIG. 5a.

Particularly preferred embodiments of this invention preferably reduce the complexity of a multistage Wiener filter by implementing a less complex series of operations rather than such conventional implementations of the normalization calculation and the normalization circuit.

A preferred implementation of a reduced complexity correlation circuit 204 preferably produces the un-normalized specification for the matched filter as χ(j) from Equation (9):

$$h(j) = m^{-1/2} \underline{x}(j) = m^{-1/2} * (1/n) \sum_{i=j-n+1}^{j} (d(i)\underline{y}(i)) \quad (11)$$

Equation (10) can be reformatted as:

$$\underline{y}_{i+1} = \underline{y}_i - (m_i^{-1/2} \underline{\chi}_i) m_i^{-1/2} \underline{\chi}_i^H) \underline{y}_i = \underline{y}_i - m_i^{-1} d_i \underline{\chi}_i \quad (12)$$

where $$d_i = \underline{\chi}_i^H \underline{y}_i \quad (13)$$

Implementing the MWF in the preferred manner discussed above can eliminate the relatively expensive normalization of every component of the vector h. The normalization preferably is replaced by the single simple scaling of a scalar signal d. In many applications the dimension of h is quite large (>100) so this represents a significant savings in complexity. Also the relatively expensive square-root operation preferably is eliminated.

The result of these preferred processes generally is not the normalized signal d. If desired, d can be calculated from the un-normalized signal d as $$d = m^{-1/2} d \quad (14)$$

Equation (14) uses the square-root operation and preferred implementations according to the present invention avoid use of the square-root operation.

In fact, the signal d can be substituted for d in the backwards stage 108 of the MWF with the result that the final output z 109 of the MWF will remain the same. Employing Equation (14) and not normalizing d, then the output of the backwards module is:

$$z_k = e_{k+1}(E(d^*_k e_{k+1})/E[|e_{k+1}|^2])^* \quad (15)$$

$$e_k = d_k - z_k \quad (16)$$

However, since from Equation (14)

$$d = m^{-1/2} d$$

Then, $$d = m^{1/2} d \quad (17)$$

Therefore $$z_k = e_{k+1}(E[(m_k^{1/2} d^*_k)e_{k+1}]/E[|e_{k+1}|^2])^*$$

$$z_k = m_k^{1/2} e_{k+1}(E[d^*_k e_{k+1}]/E[|e_{k+1}|^2])^*$$

$$z_k = m_k^{1/2} z_k \quad (18)$$

$$e_k = d_k - z_k$$

$$e_k = d_k - z_k$$

$$e_k = m_k^{1/2}(d^*_k - m_k^{1/2} z_k)$$

$$e_k = m_k^{1/2}(d^*_k - z_k)$$

$$e_k = m_k^{1/2} e_k \quad (19)$$

Proceeding now to the next reverse stage $$z_{k-1} = e_k(E[d^*_{k-1}e_k]/E[|e_k|^2])^*$$

$$z_{k-1} = (m_k^{1/2}e_k)(E[d^*_{k-1}(m_k^{1/2}e_k)]/E|(m_k^{1/2}e_k|^2|])^*$$

$$z_{k-1} = m_k e_k(E[d^*_{k-1}e_k]/m_k E[|e_k|^2])^*$$

$$z_{k-1} = e_k(E[d^*_{k-1}e_k]/E[|e_k|^2])^*$$

$$z_{k-1} = z_{k-1} \quad (20)$$

As shown above, the factor $m_k^{1/2}$ is eliminated from the output of the next reverse stage. Similarly, the factor $m_k^{1/2}$ is eliminated for all of the $d_k$ inputs to the reverse modules. Therefore the final filter output z is entirely independent of any scale factors applied to any one or more or all of the inputs to the reverse modules other than the reference input $d_0$.

There is consequently no need to normalize d. To derive this illustrated architecture, this discussion assumes that the reverse modules are at steady state. With large and rapidly changing inputs there will be a 'tracking error' due to the finite delay introduced by the expectation operators E[.]. This is normal for adaptive systems all of which generate some tracking error artifacts during periods of high speed dynamic changes in their input signals.

In preferred embodiments of the MWF circuits illustrated here, the last signal $z_1$ is normalized relative to the input reference signal $d_0$ input to the last backwards stage producing the final result z 109. This is accomplished in the final backwards stage 108 (stage 1) and thus z, the filter output 109, will be independent of the values of $m_k$ or even the amplitude of the input signal $y_0$.

FIGS. 1, 2, 3a, 3b or 3c, 4, 5b or 5c and 6 illustrate aspects of one presently preferred embodiment of a reduced complexity multistage Wiener filter. Other variations are described here that are advantageous in certain applications and environments. Outside of FIG. 1 the input signal vector y is composed of discrete samples of the received signal from one or more receiver systems (possibly including multiple sensor or antenna systems) and from various time delays of the received signal to capture both the time delay spread and spatial spread of a desired transmitted signals (t). The MWF compensates for the various delays of the multipath components of the received signal y(t) and filters out noise and interference.

In FIG. 1, the forward portion of the first MWF stage 102 accepts y(t), correlates it with a synthesized replica $d_0(t)$ 101 of at least part of the original transmitted signal and averages the result to smooth it, producing the vector $x_0$ as described in Equation (3) and as illustrated in FIG. 2. Next filter stage 102 produces the scalar signal $d = x_0^H y$. Stage 102 (the first stage) outputs the signal as d_out 104 to the next stage of the MWF. The v_out vector 103 is calculated from d and y_in as shown in FIG. 2 and is also output to the next stage.

Note that the termination symbol 105 in FIG. 1 and elsewhere has no function except to indicate on the drawings that the terminated signal is not employed further. The last stage of the MWF can be simplified by deleting any circuits in the last stage (stage 4) that are only used to produce components of the fourth stage y_out signal.

The FIG. 1 multistage Wiener filter has four stages. In general the number of stages is determined separately for each particular application and can vary widely as discussed, for example, in application Ser. No. 10/894,913, which is incorporated by reference.

As discussed above, the filter can sometimes do without the backwards module 108 of the first stage depending upon the requirements of the system in which the MWF is embedded.

FIG. 2 illustrates the processing that occurs in the forward portion of a stage of the MWF. The vector input 200, y_in is multiplied by the complex conjugate 202 of the scalar signal d_in in the vector-scalar multiplier 203. The product of this operation is integrated by the EXPECT module 204, for example as illustrated in FIG. 3a, or the EXPECT module of FIG. 3b. For CDMA applications as discussed in application Ser. No. 10/894,913, previously incorporated by reference, the EXPECT module shown in FIG. 3a is particularly advantageous. The output of the EXPECT module goes to both the '1/MAG^2' module 25 illustrated, for example, in FIG. 4 and to the NMF (normalized matched filter) module 207 illustrated, for example, in FIG. 5b. Finally, to implement the function of the blocking matrix as discussed above, the d signal output of the NMF 207 is output from this stage and also multiplies the matched filter coefficients h, with the result then subtracted from the y_in signal to produce the y_out signal.

FIG. 3a illustrates the structure of the EXPECT module as would be suitable for example for the CDMA application described in application Ser. No. 10/894,913. This implementation preferably uses a constant weighted moving average window. A shift register 301 delays each signal sample by N samples and then subtracts 302 the delayed sample from the current sample. The result, the sum 303 of the last N samples, is maintained in register 304. The result is normalized in module 308 by multiplying by 1/N. This is particularly simple when N is a power of 2.

Figure 3B:
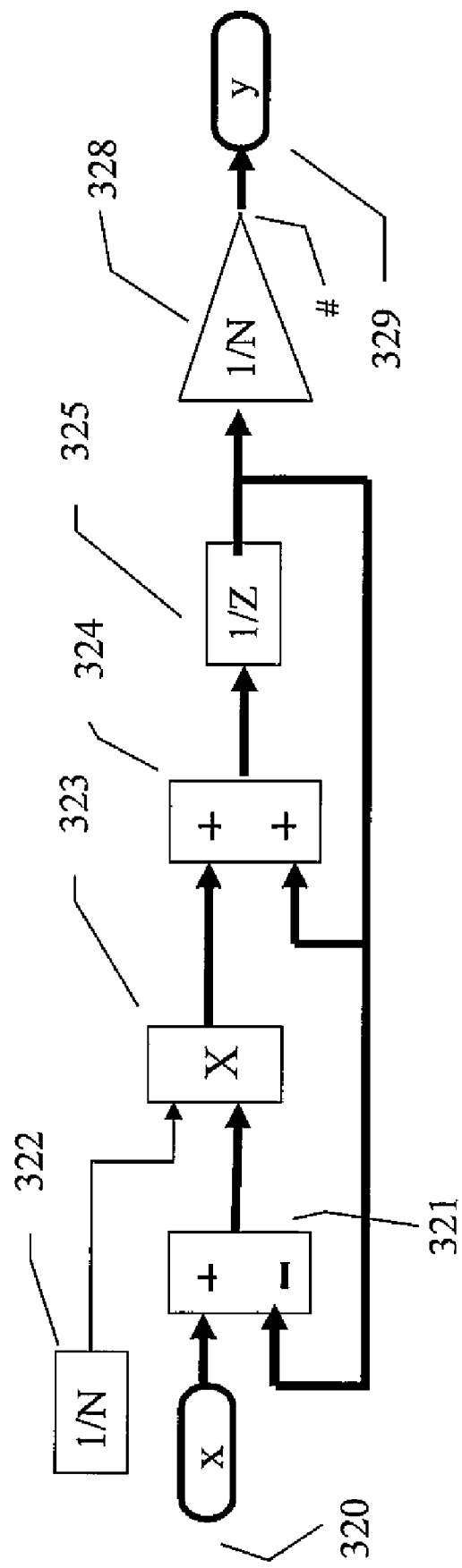
FIG. 3b schematically illustrates a preferred implementation of the expectation operator (the EXPECT module) of FIG. 2 when the filter incorporates a constant amplitude but moving window.

FIG. 3b illustrates an alternative to the circuit of FIG. 3a that provides an exponentially weighted moving average window that is inexpensive to implement and may be desirable in some applications depending upon the statistical distribution of the noise and interfering signals. In each of the various FIG. 3 illustrations of the EXPECT module, different components of the circuit are illustrated by standardized symbols so that further discussion of the operation is not needed.

Figure 3C:
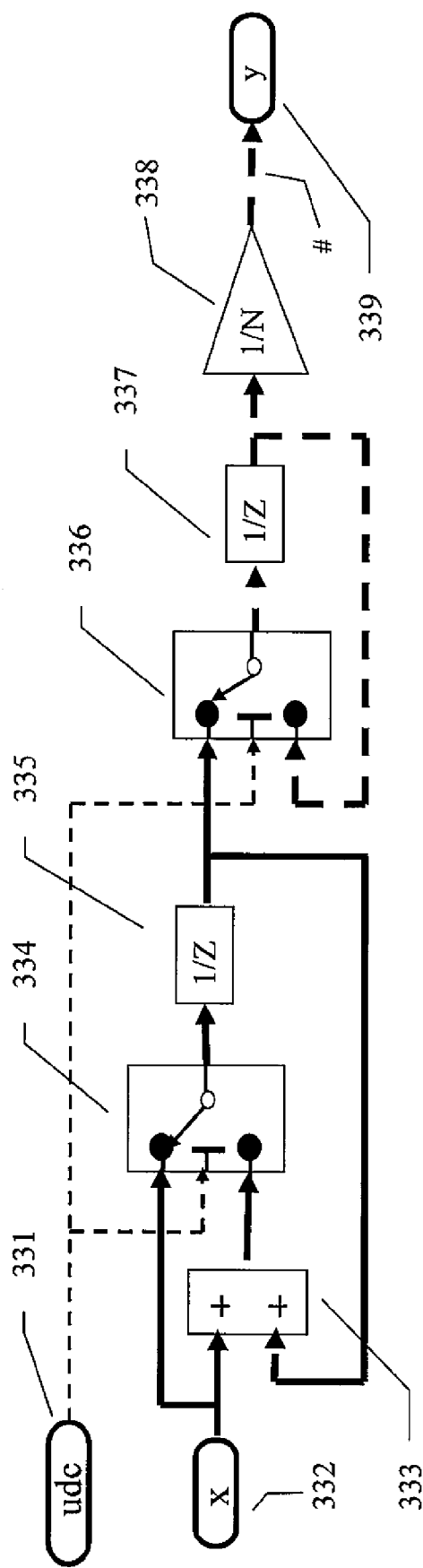
FIG. 3c schematically illustrates a preferred implementation of the expectation operator (the EXPECT module) of FIG. 2 for when the filter uses a constant amplitude window that is updated upon command as in CDMA systems.

FIG. 3c illustrates a reduced cost implementation of the EXPECT module of FIG. 3a, again as would be suitable for example for the CDMA implementation described in application Ser. No. 10/894,913. The FIG. 3c expectation operator or EXPECT module uses a constant amplitude window that is updated upon command as would be the case in CDMA systems. Filters incorporating the FIG. 3c EXPECT module are particularly preferred where the filter coefficient command update rate is considerably less than the data rate of the signal being filtered. The delay shift register 301, which can be expensive, is eliminated by replacing it with an integration circuit composed of an adder 333, switch 334 and delay 335. Then an updatable register composed of modules 336 and 335 is employed to hold the final integrated value until the next integration across the window is ready. The FIG. 3c implementation typically needs an update command 331 that preferably is initiated at the end of each integration window (when a new integration period preferably also begins). When the update command 331 arrives, the integration value is transferred to the updatable register via switch 336 and the integrator is reset by switch 334. The update command 331 is easily derived from the usual timing circuits within a receiver and external to the filter.

Figure 3D:
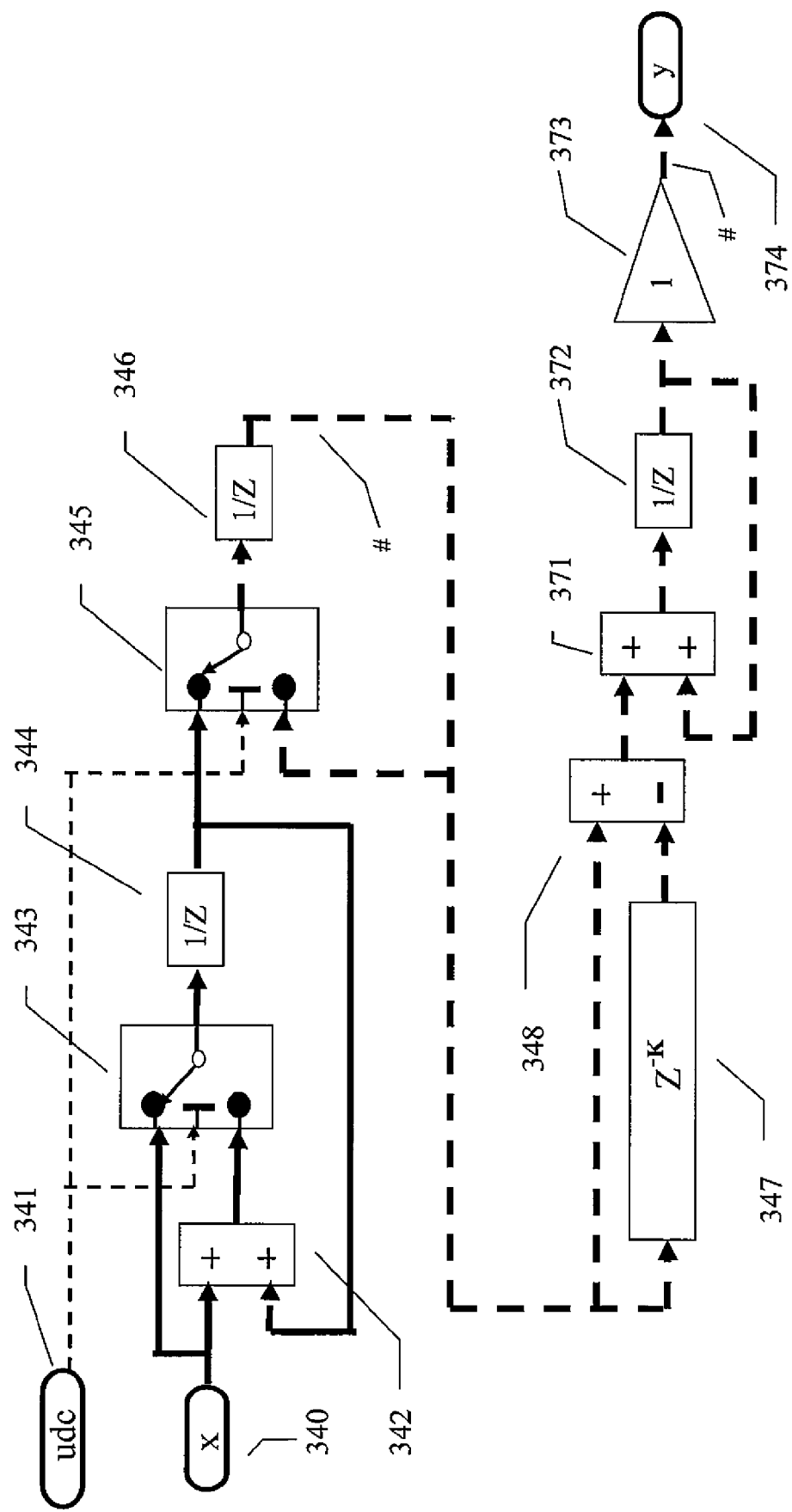
FIG. 3d schematically illustrates a preferred implementation of the expectation operator (the EXPECT module) of FIG. 2 for when the filter uses a constant amplitude window that is updated upon command as in certain CDMA systems.

FIG. 3d schematically illustrates a preferred implementation of the expectation operator (the EXPECT module) of FIG. 2 for when the filter uses a constant amplitude window that is updated upon command as in CDMA systems. In particular, the filter coefficient command update rate preferably is considerably less than the data rate of the signal being filtered. This configuration provides a total integration period composed of several window times. This version of the EXPECT module can be effective for cellular telephone service at a modest cost. It is particularly preferred for CDMA cell phone receivers.

FIG. 3d illustrates how the reduced cost benefits of the EXPECT module of FIG. 3c can be realized, while also having an update rate that is rapid so that fast changes in the filter input signal can be tracked. The integrator circuit preferably is updated by command at the desired tracking rate, but the total integration interval preferably can be selected to be considerably longer. This is accomplished by combining the integration methods of FIG. 3a and FIG. 3c. The components of FIG. 3d are illustrated and described above and that description is not repeated here. First the integration method of FIG. 3c is employed to integrate over a desired interval, for example, corresponding to a single received symbol in CDMA. Then the method of FIG. 3a is employed to integrate the results of the first integrator over a longer, constantly moving, window composed of a number of discrete windows. The result is a hybrid of the methods of FIG. 3a and FIG. 3c. The inexpensive integration of FIG. 3c is employed but an update rate can be set to be only as short as needed, in increments of the first window size. For example, if a total integration time of sixteen symbols is desired, but an update rate equal to the symbol rate is desired to track fast channel changes, then shift register 347 preferably is chosen to have a length of sixteen complex values. The update command 341 preferably is set to occur at the end of every symbol in this example.

Figure 3E:
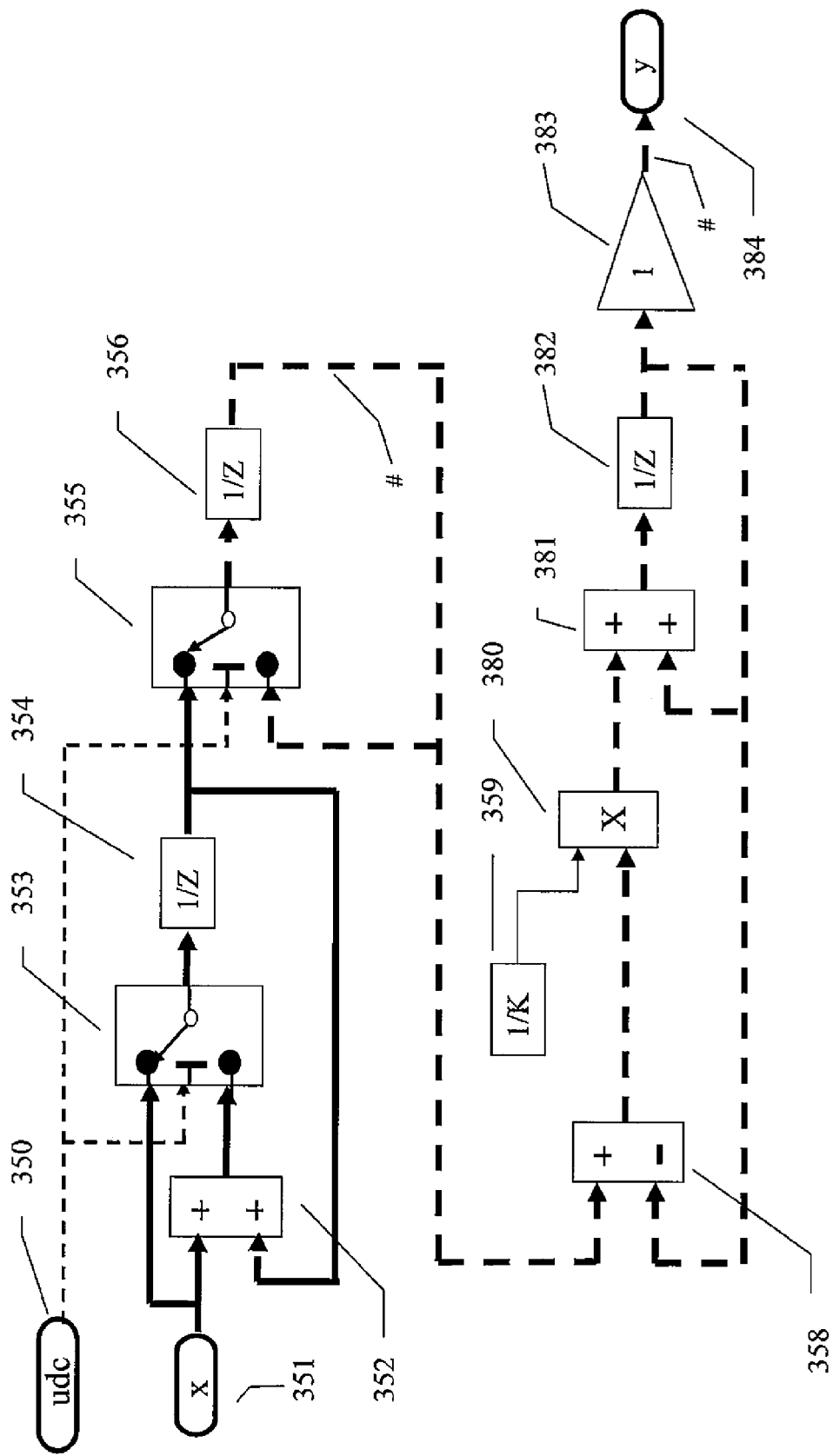
FIG. 3e schematically illustrates a preferred implementation of the expectation operator (the EXPECT module) of FIG. 2 for when the filter requires a constant amplitude window that is updated upon command as in CDMA systems.

FIG. 3e schematically illustrates a preferred implementation of the expectation operator (the EXPECT module) of FIG. 2 for when the filter requires a constant amplitude window that is updated upon command as in CDMA systems. In particular, the filter coefficient command update rate is preferably considerably less than the data rate of the signal being filtered. Depending upon the statistical distributions of the signal, noise and interfering signal processes, it may sometimes be desirable to employ such a hybrid integrator for the EXPECT module. This configuration provides an overall integration window with an exponential decay period. As one example, this version of the EXPECT module can be effective for some radio systems in inexpensive implementations.

The FIG. 3e module is very similar to FIG. 3d except the second integrator is an exponential moving window like the one shown in FIG. 3b. Thus, the FIG. 3e EXPECT module combines the module of FIG. 3c with the module of FIG. 3b, with the FIG. 3c module supplying its output to the input of the FIG. 3b module. The description of the components of these modules is provided above and is not repeated here.

Figure 3F:
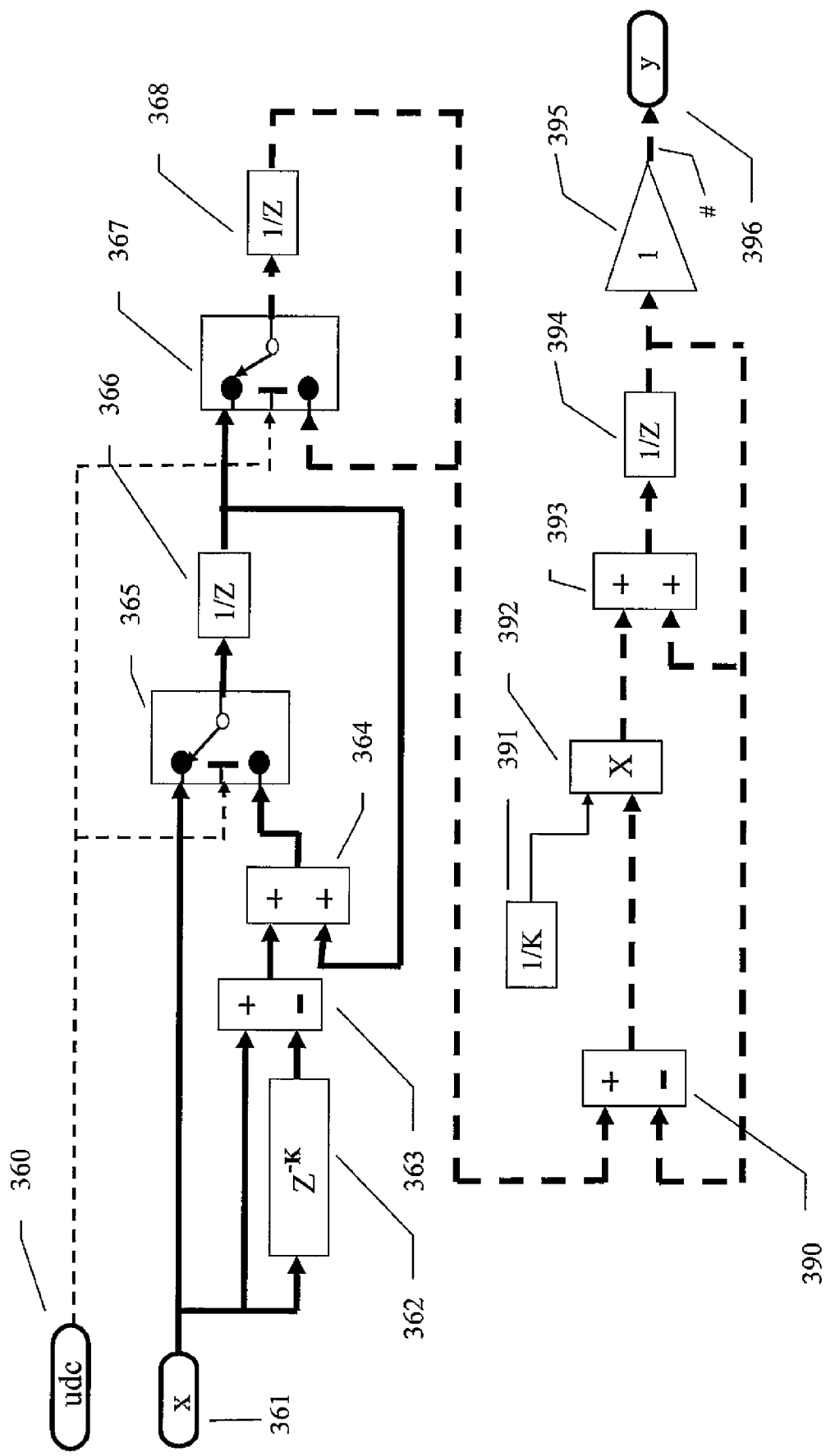
FIG. 3f schematically illustrates an implementation similar to FIG. 3e but which employs a moving exponential window on the results provided by the constant value rectangular window.

FIG. 3f schematically illustrates an EXPECT module implementation that is similar to FIG. 3e but which employs a moving exponential window on the results provided by the constant value rectangular window. The EXPECT module of FIG. 3f can be viewed as having a first set of components that provide aspects of the FIGS. 3a and 3b modules and a second set of components (starting from element 390) that corresponds solely to the module of FIG. 3b. FIG. 3f illustrates how the expectation operator (the EXPECT module) of FIG. 2 can be implemented when the first integration (first set of components) requires a constant amplitude window as in CDMA systems but the filter applies an exponential window (second set of components) to this result.

FIG. 4 illustrates a circuit to calculate the inverse squared magnitude of a vector. A complex input vector is split into real and imaginary vectors in module 411. Modules 412 and 413 square the components of these vectors and the results are summed in modules 414 and 415 and the following adder 417. Finally module 418 calculates the inverse of the result.

FIG. 5a illustrates an aspect of a multistage Wiener filter implementation according to application Ser. No. 10/894,913. The FIG. 5a circuit is typically implemented within a finite impulse response (FIR) in a digital signal processor (DSP). Note that first a square root operation 513 is performed on the input (which comes from the output of the circuit of FIG. 4). The square root operation is comparatively complex and is therefore expensive. Next the input vector $\overline{hi}$ 510 is multiplied in 514 by the output of 513. This vector result is output to the multiplier shown in FIG. 2. Multiplier 514 is comparatively complex and is therefore expensive, as it must multiply each component of the $\overline{hi}$ vector by the scalar result of the square root operation 513. Finally, the main FIR filter operation occurs in module 515 where the inner (dot) product of the $\overline{h}$ and $\overline{y}$ vectors is performed producing the scalar output signal d_out 519.

In preferred implementations of this aspect of the present invention, the circuit of FIG. 5b could, for example, be used in place of the circuit of FIG. 5a in a preferred multistage Wiener filter. FIG. 5b schematically illustrates the normalization of the filter coefficient vector and generation of a 'matched filter' output. Implementations of FIG. 5b can provide significant cost or complexity savings as compared to implementations of FIG. 5a. The FIG. 5b circuit is simpler (and therefore less expensive) than the FIG. 5a circuit. Two expensive modules, the vector-scalar multiplier 514 and the square root module 513, are eliminated in the circuit of FIG. 5b while only the simple, inexpensive scalar multiplier 525 is needed in FIG. 5b, as compared to the circuit of FIG. 5a. The circuit of FIG. 5b is most advantageous when the filter update rate is relatively high so as to rapidly adapt to changing propagation conditions.

FIG. 5c shows an alternative circuit to that of FIG. 5b and can be implemented in a less costly way than the circuit of FIG. 5b whenever the product of the vector length of the filter input signal y (signal 100, 103, etc. of FIG. 1) times the filter coefficient update rate is less than the data throughput rate of the filter (i.e., less than the sample rate of the input and output signals of the filter). This will occur, for example, in many implementations of the CDMA system discussed in application Ser. No. 10/894,913.

FIG. 6 is a preferred backward portion of the module shown in FIG. 1. It is the same as what is illustrated in application Ser. No. 10/894,913 and is shown here for completeness. Module 613 calculates the complex conjugate. The EXPECT module 617 is the same as the EXPECT module 204 of FIG. 2 and as is detailed in FIG. 3a or FIG. 3b except in this case the EXPECT module performs scalar, not vector processing.

For the CDMA applications as discussed above, it is likely that the combination of the circuits of FIGS. 1, 2, 3d, 4, 5c and 6 will provide a particularly desirable combination of modules to realize an adaptive filter. Different ones of the modules preferably can be combined according to the particular application to provide a preferred and in some cases optimum implementation.

FIGS. 1-6 illustrated aspects of different preferred embodiments of an MWF with reduced complexity. Under certain circumstances, it is possible to further reduce the complexity of a MWF by implementing aspects of what is described in U.S. Pat. No. 7,181,085 and U.S. patent application Ser. No. 10/894,913 with aspects of the strategies described above. U.S. Pat. No. 7,181,085 and application Ser. No. 10/894,913 are incorporated here by reference. The circuits described below, like those described above, can be easily realized in hardware, software or a combination of both. Important additional complexity reduction can be achieved by one or more or all aspects of this approach.

As shown above, the reverse portion of the MWF is insensitive to any constant multipliers at its inputs. Because of this, the following discussion emphasizes the forward portions of the filter.

The following explanation begins with the formulation of a fully adaptive version of an RG (Ricks & Goldstein) MWF like that described in application Ser. No. 10/894,913. The notation is updated. The filter is expanded out to three stages. A prime on a variable indicates that the primed variables (e.g., x') refer to the RG formulation variables and variables without primes indicate variables in the new formulation.

The following summarizes the RG formulation set forth in application Ser. No. 10/894,913:

{\*Inputs are: $d_0^*$, $\underline{y}_0^*$\ stage 1:{

$\underline{x}_1' = E[d_0^* \underline{y}_0]$ $m_1' = \underline{x}_1'^H \underline{x}_1'$ $\underline{h}_1' = m_1'^{-1/2} \underline{x}_1'$ $d_1' = \underline{h}_1'^H \underline{y}_0$ $\underline{y}_1' = \underline{y}_0 - d_1' \underline{h}_1'$}   (21)

stage 2:{

$\underline{x}_2' = E[d_1'^* \underline{y}_1']$ $m_2' = \underline{x}_2'^H \underline{x}_2'$ $\underline{h}_2' = m_2'^{-1/2} \underline{x}_2'$ $d_2' = \underline{h}_2'^H \underline{y}_1'$ $\underline{y}_2' = \underline{y}_1' - d_2' \underline{h}_2'$}   (22)

stage 3:{

$\underline{x}_3' = E[d_2'^* \underline{y}_2']$ $m_3' = \underline{x}_3'^H \underline{x}_3'$ $\underline{h}_3' = m_3'^{-1/2} \underline{x}_3'$ $d_3' = \underline{h}_3'^H \underline{y}_2'$ $\underline{y}_3' = \underline{y}_2' - d_3' \underline{h}_3'$}   (23)

}

In this discussion, equations surrounded by the symbols '\*' and '*\' are comments to facilitate understanding of the derivation and are not required in an implementation.

The complexity advantages of the implementations described here are associated with:

1) reorganizing operations between stages;
2) combining operations so as to limit the need to determine square roots;
3) reducing the need for division operations; and
4) concentrating arithmetic operations in signals that only occur at the filter update rate, as opposed to performing operations at the filter data processing rate.

A preferred implementation of a reduced complexity adaptive multistage Wiener filter is illustrated in the following:

{\*Inputs are: $d_0^*$, $\underline{y}_0^*$\ stage 1:{.

$\underline{x}_1 = E[d_0^* \underline{y}_0]$ $\underline{h}_1 = \underline{x}_1$ $d_1 = \underline{h}_1^H \underline{y}_0$   {(24)

stage 2:{

$m_1 = \underline{h}_1^H \underline{h}_1$ $\underline{h}_2 = m_1 E[d_1^* \underline{y}_0] - E[d_1^* d_1] \underline{h}_1$ $d_2 = \underline{h}_2^H \underline{y}_0 - (m_1^{-1}(\underline{h}_2^H \underline{h}_1))d_1$}   (25)

stage 3:{

$m_2 = \underline{h}_2^H \underline{h}_2$ $\underline{h}_3 = E[d_2^* \underline{y}_0] - m_1^{-1} E[d_2^* d_1] \underline{h}_1 - m_2^{-1} E[d_2^* d_2] \underline{h}_2$ $d_3 = \underline{h}_3^H \underline{y}_0 - (m_1^{-1}(\underline{h}_3^H \underline{h}_1))d_1 - (m_2^{-1}(\underline{h}_3^H \underline{h}_2))d_2$}   (26)

The following is a preferred reorganization of the circuitry and operations set forth above. The following discussion indicates with bold typeface those variables that preferably occur at the data sample rate and indicates the variables that preferably are determined only at the filter update rate as not-bold typeface. Using this formalism, a preferred implementation is described as follows:

{\*Inputs are: $d_0^*$, $\underline{y}_0^*$\ stage 1:{

$\underline{h}_1 = E[d_0^* ] \underline{y}_0]$ $d_1 = \underline{h}_1^H \underline{y}_0$}   (27)

stage 2:{

$u_1 = (\underline{h}_1^H \underline{h}_1)^{-1}$ $\underline{h}_2 = u_1 E[d_1^* \underline{y}_0] - E[d_1^* d_1] \underline{h} \underline{h} d\mathbf{1}$ $d_2 = \underline{h}_2^H \underline{y}_0 - (u_1(\underline{h}_2^H \underline{h}_1))d_1$}   (28)

stage 3:{

$u_2 = (\underline{h}_2^H \underline{h}_2)^{-1}$ $\underline{h}_3 = E[d_2^* \underline{y}_0] - (u_1 E[d_2^* d_1]) \underline{h}_1 - (u_2 E[d_2^* d_2]) \underline{h}_2$ $d_3 = \underline{h}_3^H \underline{y}_0 - (u_1(\underline{h}_3^H \underline{h}_1))d_1 - (u_2(\underline{h}_3^H \underline{h}_2))d_2$}   (29)

}

It is apparent from the above illustrative discussion how to extend this for any desired number of additional stages.

The large reduction in the complexity (i.e., the cost) that is achieved can be appreciated by comparing Equations 21, 22 & 23 to Equations 27, 28 & 29. Note in particular the reduced number of operations that must be executed at the data rate and the reduced number of vector arithmetic operations that may be executed in particularly preferred embodiments.

FIG. 7 illustrates an implementation of the reduced complexity, adaptive, multistage Wiener filter illustrated in the preceding discussion, here illustrated as an MWF composed of three stages. In general there can be any number of two or more stages. The number of stages is chosen by analysis or experiment in the environment in which the filter is to be employed as previously discussed here and in the incorporated patent applications. It is apparent to those skilled in the art how to extend the example here to as many more stages as are desired.

Note that in the MWF illustrated in FIG. 7, the filter input $\underline{y}_0$ 717 is supplied in parallel to all of the stages.

Preferably, the FIG. 7 filter avoids the conventional normalization of the filter coefficients h by eliminating the multiplication by $m^{-1/2}$ and instead calculating only the factor m, which most preferably is moved to following stages. The vector subtraction of (d h) from $\underline{y}$ that occurred at the data rate in the filters of the incorporated patent applications preferably is eliminated. These and other modifications lead to the reduced complexity discussed here.

The backward modules (e.g., module 718) can be chosen to be identical to those used in FIG. 1 above and, for example, as shown in detail in FIG. 6.

FIG. 8 illustrates a preferred circuit implementation of the first stage forward module 715 of FIG. 7. It is similar to the circuits shown above and employs not only the simple arithmetic components but also the components 805 and 807 as illustrated in FIG. 3d and FIG. 4. These operate as explained above. The inputs $\underline{y}_0$ and $d_0$ and the output signals outputs z, d, h and m are the same as developed and discussed above.

FIG. 9 illustrates the circuit of the second stage forward module 717 of FIG. 7. It has the circuitry of FIG. 8 along with that of FIG. 11 whose outputs are combined with the FIG. 8 style circuits by the two adders that produce the outputs d2 and h2. It is the COMP module 908 detailed in FIG. 11 that calculates the compensation signals that are fed to the adders.

FIG. 10 illustrates the circuit of the third stage forward module 719 of FIG. 7. It has the circuitry of FIG. 9 along with that of another FIG. 11 module 1011 whose outputs are also combined with the FIG. 8 style circuits by the two adders that produce the outputs d3 and h3. It is the COMP module 1011 (FIG. 11) that calculates the additional compensation signals that are fed to the adders to produce the outputs d3 and h3. FIG. 11 illustrates the circuit of the COMP modules 908, 1010 and 1011 employed in FIGS. 9 and 10.

For the three stage filter illustrated in FIGS. 7-11, the h3 1016 and m3 1017 signal outputs of FIG. 10 module 719 of FIG. 7 are not used further and the circuit 1012 that produces m3 can be eliminated If more than three stages are needed then, of course, this simplification cannot occur. It is also possible that more complex modules (straight forward expansions of FIG. 10) will be needed. This case of needing more complex modules is expected to be rare and the module shown in FIG. 10 can generally be repeatedly employed in a straight forward way for the additional stages. This is because there is little or no correlation between the signals $d_i$ and $d_j^*$ of FIG. 11 for i>j+1. There can be some small correlation, depending on the dynamics of interfering signals and the amount of integration time allowed in the EXPECT modules. Therefore the decision as to whether or not FIG. 10 is preferred for higher stages preferably is determined by experiment or analysis within the particular contemplated interference environment.

Analysis of the various strategies set out here is preferred to arrive at the preferred and sometimes optimum combination of modules for any given filtering application. For the CDMA applications as discussed in the patent application Ser. No. 10/894,913, it is likely that the combination of FIGS. 3d, 4, 6, 7, 8, 9, 10 and 11 will provide an especially advantageous combination of modules for the adaptive filter to be used in that environment.

The MWF implementations described here can also be applied to CDMA systems that do not employ continuous pilot reference signals (e.g., the EVDO CDMA cellular telephone or other EVDO CDMA radio system). Currently implemented versions of these systems time multiplex a pilot reference signal with the CDMA modulated sub channels. The MWFs presented here can be implemented in these discontinuous pilot types of systems by providing an aligned synthetic pilot reference signal d0 that is gated off (i.e., set to the value 0) during the time that the CDMA portion of the received signal is being received so that d0 is only non-zero during the time that the multiplexed CDMA pilot reference sub channel signal is present. This is easily accomplished by those skilled in the art of CDMA communication systems.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

The various embodiments described here provide advantages to various applications and different operating environments. Certain preferred embodiments can provide a fully adaptive MWF, with the conventional steering vector of the first stage of an RG implementation as described above replaced with a fully adaptive matched filter that accepts a pilot reference signal instead of the fixed steering vector. The reverse modules or backward parts described here are also fully adaptive. Such fully adaptive MWFs are particularly useful when combined with the elimination of normalization operations discussed above.

Various implementations of an expectation module are adapted for varying application environments, including for CDMA filtering applications. These expectation modules are especially advantageous for their simplified and comparatively inexpensive operation. The above describes techniques for eliminating square-root operations.

The elimination of normalization operations are particularly advantageous when implemented with an MWF organized to provide a filter update (adaptation) rate separate from the filter data processing rate.

I claim:

1. A multiple stage Wiener filter comprising a plurality of stages in which at least one stage is composed of a forward part and a backward part, wherein the forward part comprises:
   a scalar-vector correlation circuit that determines an expectation value for a product of a complement of a scalar input signal input to the stage and a vector input signal input to the stage, the scalar-vector correlation circuit producing a vector correlation circuit output signal;
   a vector subtraction circuit that subtracts a compensated vector signal produced by a compensation circuit from the vector correlation circuit output signal;
   a vector squared-magnitude circuit that accepts the vector correlation circuit output signal from the vector subtraction circuit and determines a scalar squared-magnitude circuit output signal that is a reciprocal of a sum of squared magnitudes of components of the vector correlation circuit output signal;
   a first filter circuit that accepts the vector output signal from the vector subtraction circuit and the vector signal input to the stage and produces with an inner product calculation a scalar filter circuit output signal; and a scalar subtraction circuit that subtracts a compensated scalar signal generated by the compensation circuit from the scalar filter circuit output signal;

wherein the compensation circuit accepts as inputs two vector signals, a first scalar signal and its complement, and a first scalar magnitude signal, the compensation circuit producing as outputs the compensated vector signal and the compensated scalar signal, wherein the compensation circuit comprises:

a first scalar multiplier circuit that calculates determines a squared magnitude signal from the first scalar signal and its complement, a scalar-scalar correlation circuit that receives the squared magnitude signal and determines and outputs an expectation value for the squared magnitude of the first scalar signal, a scalar-scalar multiplier circuit that multiplies the expectation value output by the scalar-scalar correlation circuit by the input scalar magnitude signal to produce a scalar-scalar multiplier circuit output, a vector-scalar multiplier circuit that multiplies the output of the scalar-scalar multiplication circuit by a first vector signal input to the compensation module producing the compensated vector signal, a second filter circuit that accepts the two vector signals input to the compensation circuit and produces a scalar magnitude output signal, a second scalar multiplier circuit that multiplies the scalar magnitude output signal from the second filter circuit by the first scalar magnitude signal producing a second magnitude signal, and a third scalar multiplier circuit that multiplies the second magnitude signal by the first scalar input signal producing the compensated scalar signal.

2. The filter of claim 1, wherein the first filter circuit is a finite impulse response filter.

3. The filter of claim 1, wherein the backward part of the multiple stage Wiener filter is a scalar Wiener filter.

4. A receiver for a communication system comprising a multiple stage Wiener filter, the multiple stage Wiener filter comprising a plurality of stages in which at least one stage is composed of a forward part and a backward part, wherein the forward part comprises:

a scalar-vector correlation means for determining an expectation value for a product of a complement of a scalar input signal input to the stage and a vector input signal input to the stage, the scalar-vector correlation means producing a vector correlation output signal;

a vector subtraction means for subtracting a compensated vector signal produced by a compensator from the vector correlation output signal;

a vector squared-magnitude means that accepts the vector correlation output signal from the vector subtraction means and calculates a scalar squared-magnitude output signal that is a reciprocal of a sum of squared magnitudes of components of the vector correlation output signal;

a first filter means that accepts the vector output signal from the vector subtraction means and the vector signal input to the stage for producing with an inner product a scalar filter output signal; and a scalar subtraction means for subtracting a compensated scalar signal generated by the compensator from the scalar filter output signal;

wherein the compensator accepts as inputs two vector signals, a first scalar signal and its complement, and a first scalar magnitude signal, the compensator producing as outputs the compensated vector signal and the compensated scalar signal, wherein the compensator comprises:

a first scalar multiplier means for determining a squared magnitude signal from the first scalar signal and its complement, a scalar-scalar correlation means that receives the squared magnitude signal for determining and outputting an expectation value for the squared magnitude of the first scalar signal, a scalar-scalar multiplier means for multiplying the expectation value output by the scalar-scalar correlation means by the input scalar magnitude signal to produce a scalar-scalar multiplier means output, a vector-scalar multiplier means that multiplies the output of the scalar-scalar multiplication means by a first vector signal input to the compensator producing the compensated vector signal, a second filter that accepts the two vector signals input to the compensator and produces a scalar magnitude output signal, a second scalar multiplier means for multiplying the scalar magnitude output signal from the second filter means by the first scalar magnitude signal producing a second magnitude signal, and a third scalar multiplier means for multiplying the second magnitude signal by the first scalar input signal producing the compensated scalar signal.

5. The filter of claim 4, wherein the first filter means is a finite impulse response filter.

6. The filter of claim 4, wherein the backward part of the multiple stage Wiener filter is a scalar Wiener filter.

* * * * *